(12) United States Patent
Balasubramanian et al.

(10) Patent No.: US 11,815,971 B2
(45) Date of Patent: Nov. 14, 2023

(54) BOUNDARY PORT POWER IN PENT MODELLING AND MANAGEMENT

(71) Applicant: Texas Instruments Incorporated, Dallas, TX (US)

(72) Inventors: Lakshmanan Balasubramanian, Bengaluru (IN); Aswani Kumar Golla, Bengaluru (IN); Venkatraman Ramakrishnan, Bengaluru (IN); Sushmitha Tudiyadka Girijashankar, Sullia Taluk (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 114 days.

(21) Appl. No.: 17/156,910

(22) Filed: Jan. 25, 2021

(65) Prior Publication Data

US 2021/0255682 A1    Aug. 19, 2021

(30) Foreign Application Priority Data

Jan. 24, 2020    (IN) .............................. 202041003204

(51) Int. Cl.
  *G06F 30/30*    (2020.01)
  *G06F 1/26*     (2006.01)
  *G06F 30/38*    (2020.01)
  *H03K 3/037*    (2006.01)

(52) U.S. Cl.
  CPC .............. *G06F 1/266* (2013.01); *G06F 30/38* (2020.01); *H03K 3/037* (2013.01)

(58) Field of Classification Search
  CPC .......... G06F 1/266; G06F 30/38; H03K 3/037
  See application file for complete search history.

(56) References Cited

U.S. PATENT DOCUMENTS

| | | | | |
|---|---|---|---|---|
| 8,407,635 | B2* | 3/2013 | Chopra | G06F 30/3323 716/109 |
| 10,095,821 | B1* | 10/2018 | Lin | G06F 30/33 |
| 10,769,336 | B1* | 9/2020 | Zhang | G06F 30/38 |
| 2013/0338991 | A1* | 12/2013 | Lin | G06F 30/367 703/14 |
| 2018/0365367 | A1* | 12/2018 | Kerr | G06F 30/392 |

\* cited by examiner

*Primary Examiner* — Jack Chiang
*Assistant Examiner* — Brandon Bowers
(74) *Attorney, Agent, or Firm* — Krista Y. Chan; Frank D. Cimino

(57) ABSTRACT

A method for boundary port modelling that correctly handles back-to-back isolation intent, level shifter intent and voltage level association, by providing hard association of power domains to soft data objects, such as wires. The method includes identifying a boundary port in a detailed power intent (DPI) for a soft design object (SDO). A non-wire object is inserted in the SDO for the boundary port. In the DPI, a power domain of the boundary port is assigned to the non-wire object.

21 Claims, 6 Drawing Sheets

BOUNDARY PORT POWER IN PENT MODELLING AND MANAGEMENT

CROSS-REFERENCE TO RELATED APPLICATIONS

This application claims priority to India Provisional Application No. 202041003204, filed Jan. 24, 2020, entitled "Method for Hard Association of Power Domains to Soft Design Objects." which is hereby incorporated by reference in its entirety.

BACKGROUND

As integrated circuits (ICs) become larger and more complex, circuit power conservation becomes increasingly important. To manage power consumption, a variety of circuit techniques may be in implemented, including multiple power supply voltages, clock gating, and enabling power to a circuit only when the circuit is active. IC development tools, such as simulators, formal verification tools, and the like, must understand the power control features applied in the circuits. File formats, such as common power format (CPF) and unified power format (UPF) have been developed to communicate power information to the IC development tools.

SUMMARY

A method for boundary port modelling that correctly handles back-to-back isolation intent and the voltage level and power domain association needed for a) level shifter intent and b) interface elements needed in the analog-digital interface of an analog and mixed-signal (AMS) design and co-simulation environment is described herein. The boundary port modelling method provides hard association of power domains to soft data objects, such as wires. In one example, a method includes identifying a boundary port in a detailed power intent (DPI) for a soft design object (SDO). A non-wire object is inserted in the SDO for the boundary port. In the DPI, a power domain of the boundary port is assigned to the non-wire object.

In another example, a system includes a processor and a memory. The memory is coupled to the processor. The memory stores instructions that are executed by the processor to identify a boundary port in a DPI for an SDO. The instructions are also executed by the processor to insert, in the SDO, a non-wire object for the boundary port, and to assign, in the DPI, a power domain of the boundary port to the non-wire object.

In a further example, a non-transitory computer-readable medium is encoded with instructions that when executed cause a processor to identify a boundary port in a DPI for an SDO. The instructions, when executed, also cause the processor to insert, in the SDO, a non-wire object for the boundary port, and assign, in the DPI, a power domain of the boundary port to the non-wire object.

BRIEF DESCRIPTION OF THE DRAWINGS

For a detailed description of various examples, reference will now be made to the accompanying drawings in which.

DETAILED DESCRIPTION

Low power integrated circuits may include multiple power/voltage domains in which circuits can be individually disabled to reduce the power consumed by the integrated circuit. The design and verification of low power integrated circuits is facilitated by specification of circuit power information (power intent) in power format documents, such as a common power format (CPF) document or a unified power format (UPF) document. Power intent (PI) includes power connectivity and power management functionality. The power format document may be referenced by the various design and verification tools employed in integrated circuit development to ensure that circuit power specifications are applied consistently.

Circuitry included on an integrated circuit may be specified as 1) soft design objects (SDO) that describe circuit behavior without circuit power information, for example, as register transfer level (RTL) elements, or as 2) hard design objects (Hard IP) that specify complete behavior including power information, placement and routing of all circuit elements. The power domain association of SDO elements is flexible and fluid. Power domain information cannot be associated with RTL wire objects. In a power format document, black box power intent (BBPI), usually associated with a Hard IP, describes only boundary related power domains and boundary ports of a circuit. Power domain associations specified using BBPI are unconditionally honored by development tools. However, for a given circuit, the usability of the BPPI is related to the availability of a fully implemented power connected, power aware gate level or device level netlist for the circuit. Because such circuits mature late in the design process, integration and verification of an integrated circuit that includes the given circuit is delayed.

In a power format document, detailed power intent (DPI) specifies all rules related to power domains, level shifting, isolation, state retention, power switching, etc. to be applied to an SDO by the development tools. Boundary ports specified in a DPI are not unconditionally honored by the development tools. This flexibility aids in design optimization during synthesis and implementation, but poses a problem when a DPI is applied to soft abstractions of portions of Hard IP at an early stage of design intent capture, integration, and verification. For example, incorrect isolation inferences on signal paths involving back-to-back isolation and/or incorrect level shifter and signal voltage level inferences on signal paths involving an analog to digital interface in AMS design and co-simulation can adversely affect circuit verification. To avoid this problem, simulations of Hard IP may be delayed until late in the design cycle and performed using BBPI, but delaying the simulations extends design time and increases design cost.

Figure 1:
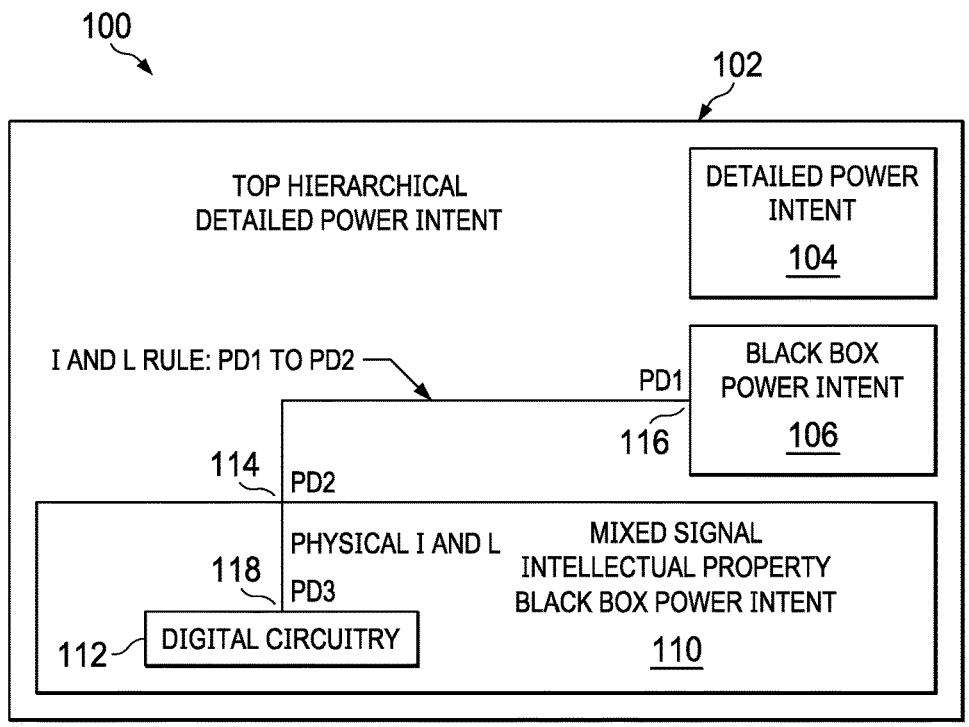
FIG. 1 illustrates an example of mixed-signal hard intellectual property (IP) integrated on a system on chip (SoC) in a mature design phase.

FIG. 1 illustrates mixed-signal Hard IP integrated on a system on chip (SoC) 100 in a mature design phase. The SoC 100 is represented as a top hierarchical DPI 102 that includes a DPI 104 representing a digital soft design (RTL), a BBPI 106 representing a Hard IP (either digital or analog), and a mixed-signal intellectual property (MSIP) BBPI 110. The MSIP represented by MSIP BBPI 110 includes a fully implemented digital circuitry 112. The BBPI 106 is a Hard IP that includes a boundary port 116 in a power domain 1, and the MSIP BBPI 110 is a Hard IP that includes a boundary port 114 in a power domain 2. The boundary port 114 is driven from a boundary port 118 and buffer in the digital circuitry 112, which is in the power domain 3. To avoid an unknown state on the net between the boundary port 118 and the boundary port 114, the Hard IP of the MSIP BBPI 110 includes a physical isolation cell (and a level shifter cell in cascade, if power domain 2 and power domain 3 belong to different voltage domains) within the MSIP BBPI 110 between the boundary port 118 and the boundary port 114. The top hierarchical DPI 102 includes an isolation rule that causes the development tools to place an isolation cell in the path between the boundary port 114 and the boundary port 116 to avoid an unknown state on the net between the boundary port 114 and the boundary port 116 when the circuitry of the MSIP BBPI 110 and power domain 2 is powered off. The top hierarchical DPI 102 also includes a level shifter rule that causes the development tools to place a level shifter cell in the path between the boundary port 114 and the boundary port 116. Inclusion of the level shifter cell prevents an unknown state due to incompatible voltage levels on the net between the boundary port 114 and the boundary port 116 during normal operations of the circuitry of the MSIP BBPI 110 under all power state conditions of power domain 2, especially when power domain 2 and power domain 1 belong to different voltage domains.

Figure 2:
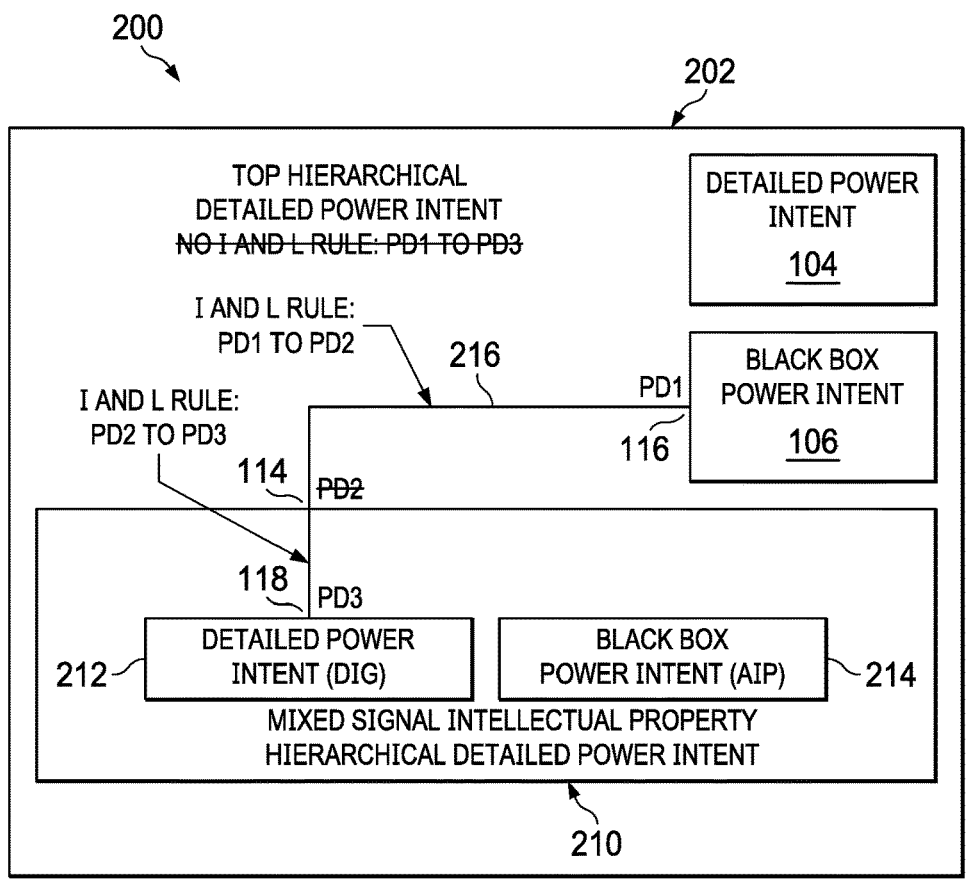
FIG. 2 illustrates and example of the SoC of FIG. 1 in an early design phase.

FIG. 2 illustrates the SoC 200, which is an early design phase of the SoC 100. The SoC 200 is represented as a top hierarchical DPI 202 that includes the DPI 104, the BBPI 106, and a mixed-signal hierarchical BBPI 210. The mixed-signal hierarchical DPI 210 includes a BBPI 214 that describes analog circuitry, and a DPI 212 that describes digital circuitry. That is, the DPI 212 is associated with an SDO that describes the behavior of digital circuitry in power domain 3, and corresponds to the digital circuitry 112 of the SoC 100. While the digital circuitry 112 includes a physical isolation and level shifter cells, in the SoC 200 the digital circuitry 112 is in a soft abstraction (RTL) at an early design state and does not include the physical isolation and level shifter cells. In the SoC 200, the need for the isolation cell is inferred from the DPI of the digital circuitry.

In the SoC 200, the top-level PI of the MSIP is expressed as a DPI with integration of the digital DPI and analog BBPI instantiated along with their RTL and analog behavioral model (BMOD) respectively, with an isolation rule for the domain crossing between PD2 and PD3. In the current state of LP (low power) system integration, the power domain 2 association of the boundary port 114 (in DPI) is ignored in the absence of any other logic load connected to it and a direct domain crossing between the boundary port 116 in power domain 1 and the boundary port 118 in power domain 3 is inferred, and in the absence of any isolation/level shifter rule in the SoC level DPI, no isolation/level shifter cell will be inferred in the entire path between power domain 3 and power domain 1. Thus, the isolation/level shifter inferences on the signal path 216 are incorrect and can adversely affect circuit verification. Further, in an analog mixed-signal design, for example when the design associated with the BBPI 106 or any RTL instantiated cell is represented by a device level abstraction (SPICE as an example), for a more accurate analog mixed-signal co-simulation there are requirements for correct voltage level association of boundary port 118 of DPI 212, boundary port 114 of MSIP DPI 210, and boundary port 116 of BBPI 106 in the signal path 216 and/or other associated boundary ports.

The systems and methods disclosed herein allow for early simulation of Hard IP using DPI with correct handing of back-to-back isolation intent, level shifter intent and voltage level association, by providing hard association of power domains to SDOs, such as wires. A boundary port modelling method that enables hard association of power domains to SDOs is described. The boundary port modelling method is applicable to both behavioral analog models (BMOD) and RTL of SDOs associated with DPIs. SDOs are associated with power domains by converting wire objects to simple non-wire objects (e.g., buffers) with an appropriate power domain association. In one example, boundary ports of an SDO are identified, and a primitive buffer, or any other circuit element configured for buffer functionality is inserted, in RTL or BMOD, at each boundary port. Each buffer instance inserted at a boundary port is associated with the respective boundary port power domain in the DPI. With these boundary port substitutions, the SDO may be simulated at an early stage of development, without failures caused by erroneous inferences on paths involving back-to-back isolation, level shifter and voltage level association, to accelerate circuit design and verification.

Figure 3:
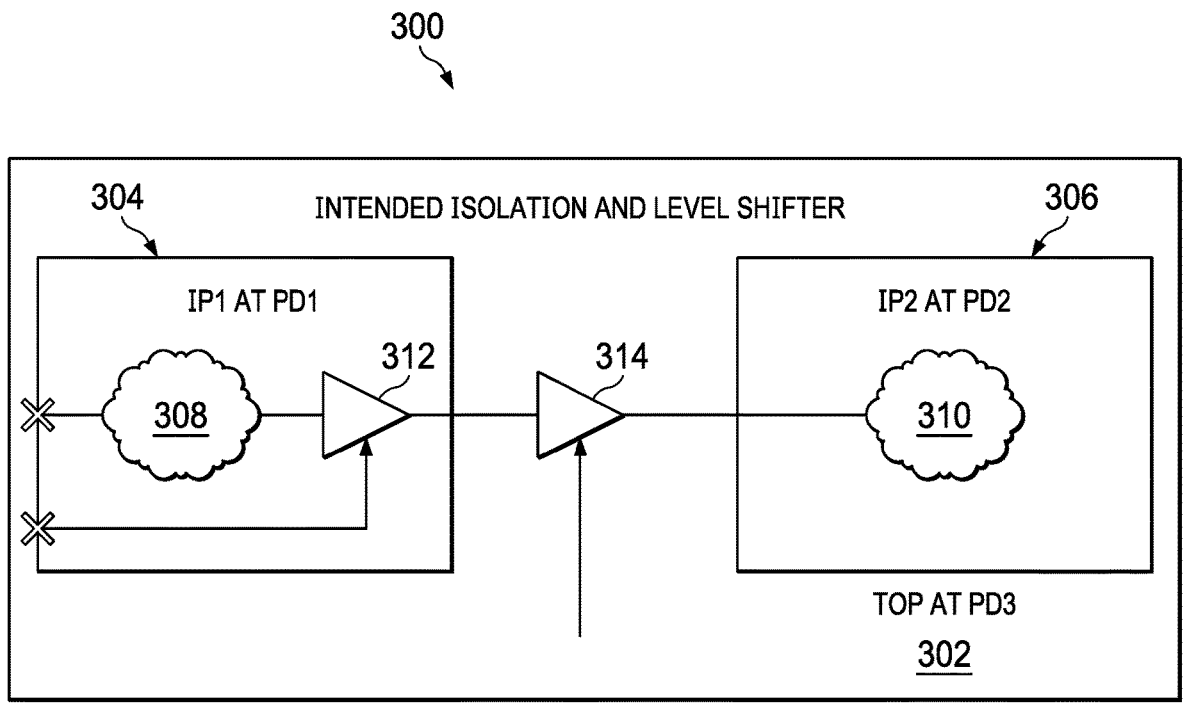
FIG. 3 shows an example of intended isolation in a circuit that includes multiple power domains.

FIG. 3 shows an example of intended isolation and a level shifter in a circuit 300 that includes multiple power domains. The circuit 300 includes a top-level power domain 302, a power domain 304, and a power domain 306. Circuit 308 operates in the power domain 304, and circuit 310 operates in the power domain 306. The circuit 308 assumes a power domain 304 to top-level power domain 302 power transition and a top-level power domain 302 to power domain 306 power transition is needed by design. A buffer/physical isolation/level shifter cell 312, disposed in the power domain 304, provides isolation/level shifting between the power domain 304 and the top-level power domain 302. A buffer/inferred isolation/level shifter cell 314, disposed in the top-level power domain 302, provides isolation between the top-level power domain 302 and the power domain 306. Thus, a signal generated by the circuit 308, in the power domain 304, is provided to the circuit 310, in the power domain 306, via the top-level power domain 302 with required isolation/level shifting between the power domains.

Figure 4:
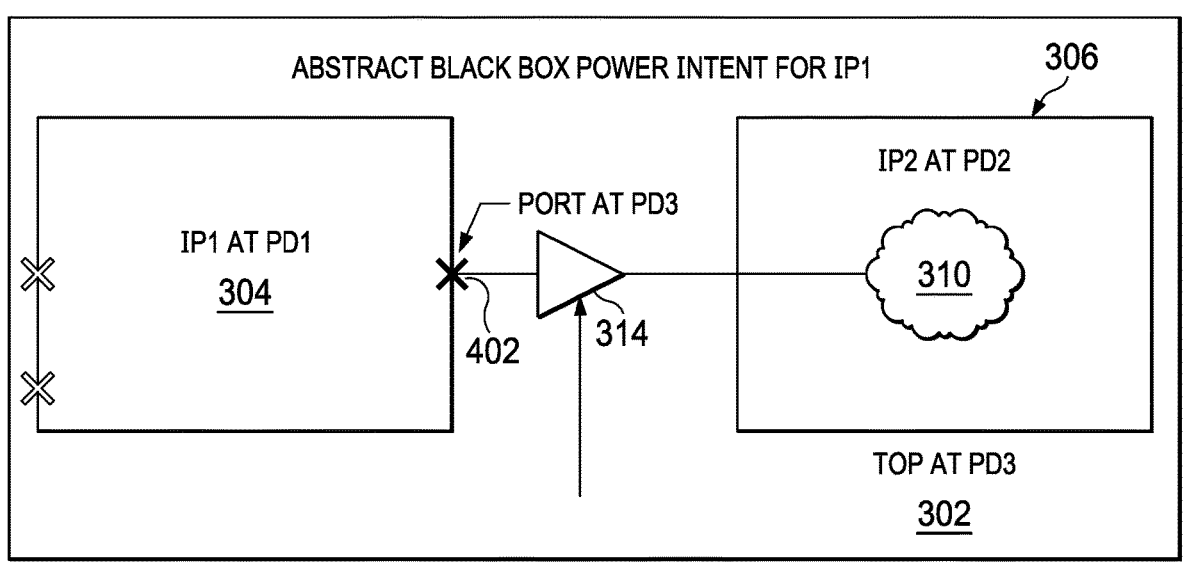
FIG. 4 shows an example of abstract power intent for a circuit of a selected power domain in the circuit of FIG. 3.

FIG. 4 shows an example of an abstract power intent (BBPI) for the power domain 304. The buffer/physical isolation/level shifter cell 312 (physically present in power domain 304) and 314 (to be inferred by an isolation/level shifter rule in DPI) associated with the boundary port 402 are provided in implementation and verification.

Figure 5:
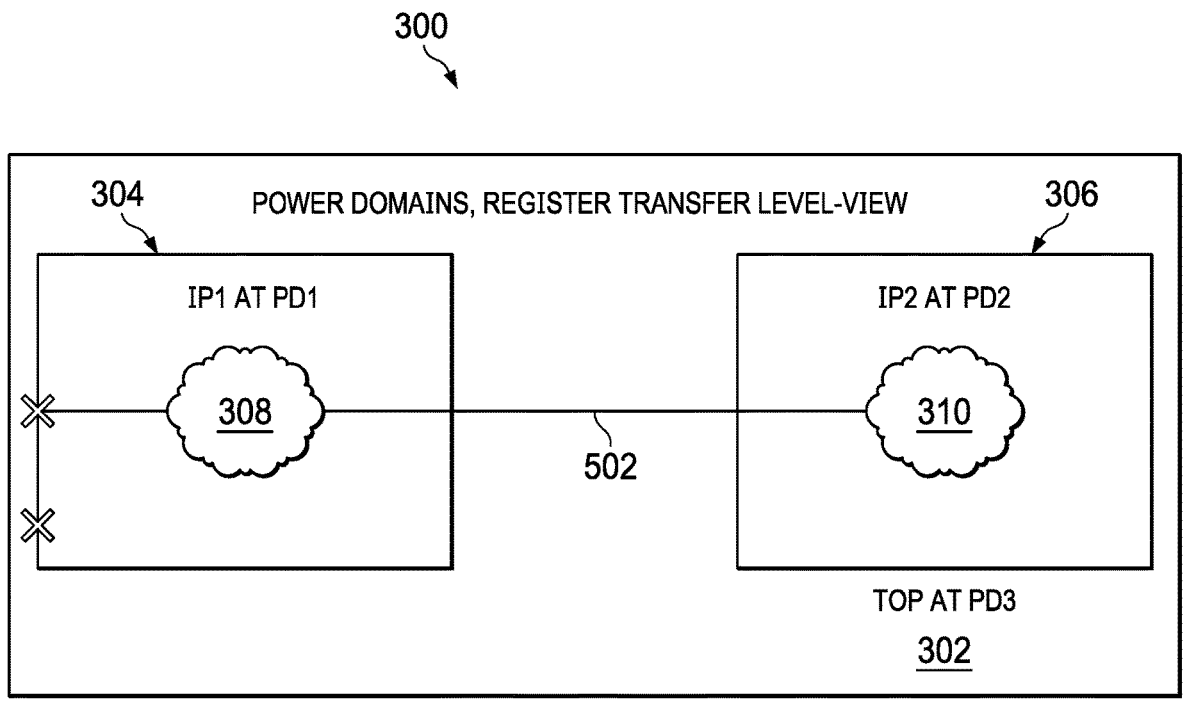
FIG. 5 shows an example of a register transfer level (RTL) view of the power domains of the circuit of FIG. 3.

FIG. 5 shows an example of an RTL view of the power domains of the circuit of FIG. 3. In the RTL view, only a transition from the power domain 304 to the power domain 306 is indicated, which is incorrect and can cause corruption through the RTL wire 502.

Figure 6:
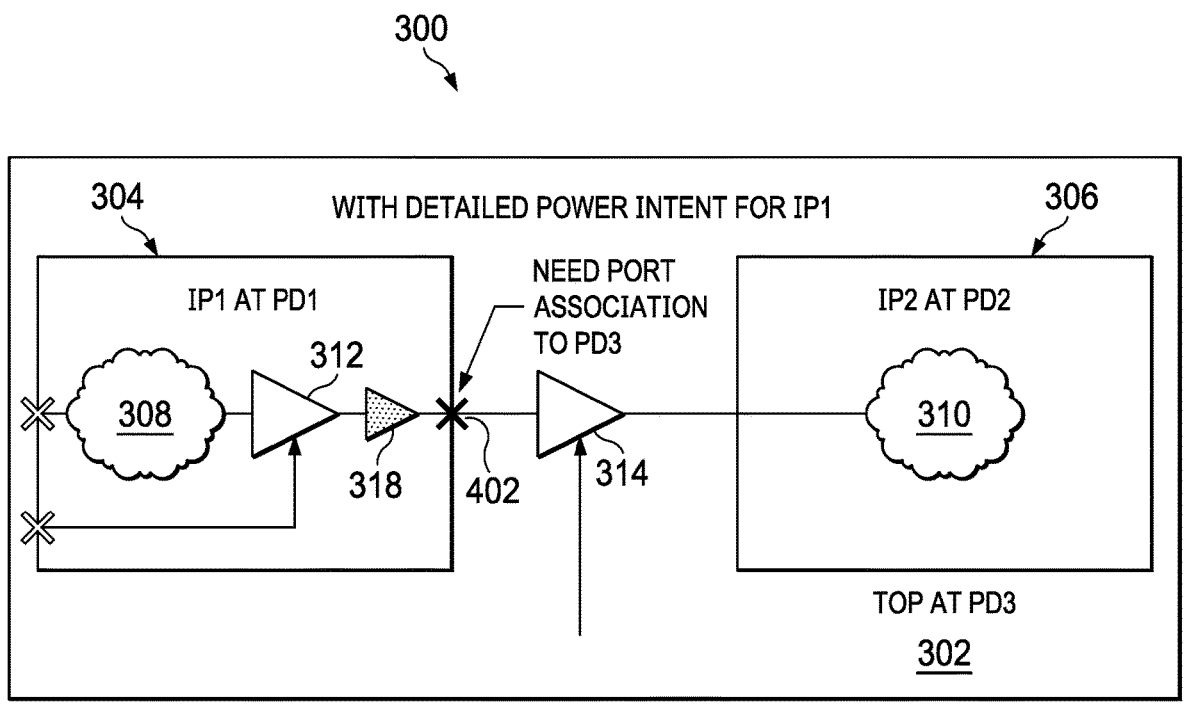
FIG. 6 shows an example of power domain association with a soft design object (SDO) representation of at least a portion of the circuit of FIG. 3.

FIG. 6 shows an example of power domain association with an SDO representation of the circuit 308. The boundary port modelling of the present disclosure identifies the boundary port 402 and adds the buffer 318 (or other non-wire object) to definitively associate a power domain to the boundary port 402. This will result in correct inference of buffer/physical isolation/level shifter cell 312 and 314 to provide isolation between the power domain 304 and the top-level power domain 302, and between the top-level power domain 302 and the power domain 306 respectively, and thereby provide correct verification behavior with the DPI describing the power domain 304.

Figure 7:
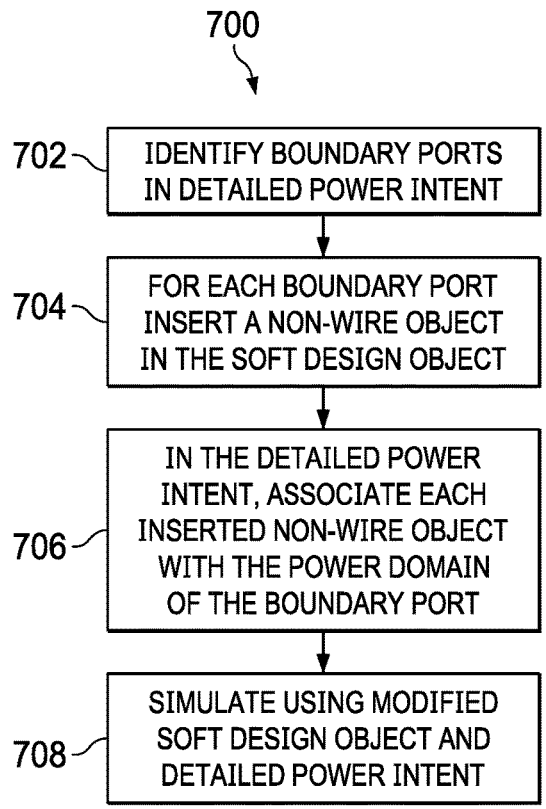
FIG. 7 shows a flow diagram for an example method for boundary port modelling that provides isolation between power domains.

FIG. 7 shows a flow diagram for an example method 700 for boundary port modelling that provides for definitive association of a power domain to an identified port of an SDO to ensure proper isolation/level shifting between power domains. Though depicted sequentially as a matter of convenience, at least some of the actions shown can be performed in a different order and/or performed in parallel. Additionally, some implementations may perform only some of the actions shown. In the method 700, the behavior of circuitry (e.g., circuit 308) is represented as an SDO, and power information for the SDO (e.g., the power domain 304) is provided as a DPI.

In block 702, the boundary ports (e.g., the boundary port 402) are identified. For example, the DPI describing the power domain 304 is searched, and the boundary port 402 is identified. The DPI may indicate, via a flag or other means, that the boundary ports of the power domain 304 are to be identified for definitive power domain association needed to properly implement isolation/level shifter and/or infer voltage level association.

In block 704, for each boundary port identified in block 702, a non-wire object, such as a buffer object (e.g., the buffer 318) is inserted in the SDO associated with the circuit 308. The non-wire object provides a means to definitively associate a power domain to the boundary port 402 of the SDO to ensure proper isolation/level shifter inference between two power domains (e.g., to isolate the power domain 304 from the top-level power domain 302 and/or level shift between the power domain 304 and the top-level power domain 302).

In block 706, for each non-wire object added to the SDO in block 704, the non-wire object is associated with the power domain of the boundary port identified in block 702 that triggered insertion of the non-wire object in the SDO.

In block 708, a verification procedure, such as a simulation, is executed using the SDO and the DPI as modified in blocks 704 and 706. The power domain isolation provided by the added buffers corrects the improper signal association and corruption that may occur due to connection of power domains via a wire of an SDO.

Figure 8:
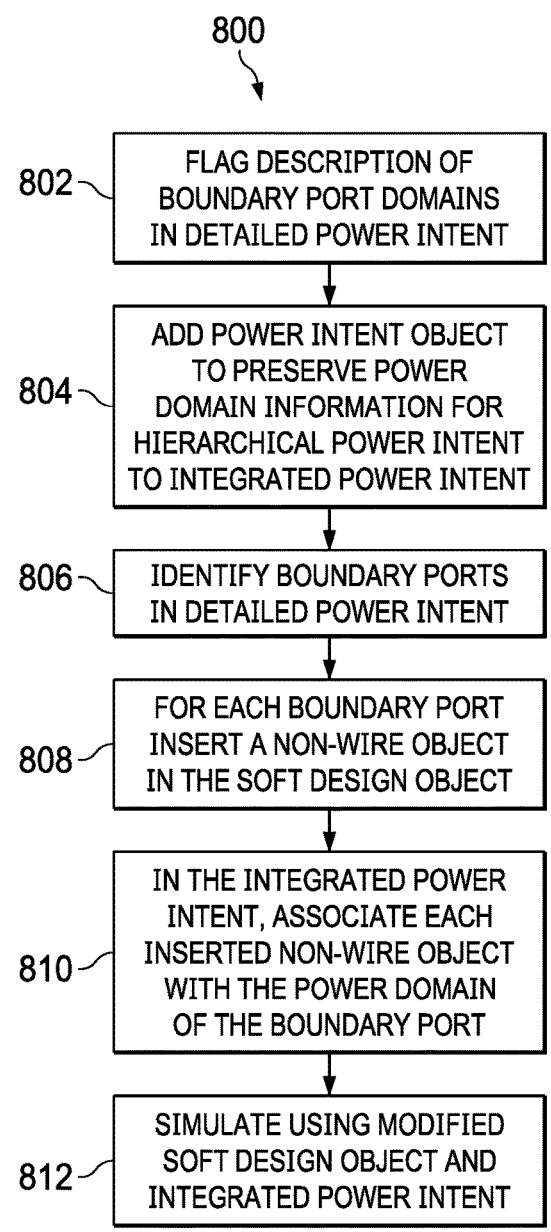
FIG. 8 shows a flow diagram for an example method for boundary port modelling that provides isolation between power domains.

FIG. 8 shows a flow diagram for an example method 800 for boundary port modelling that provides for definitive association of a power domain to an identified port of an SDO to ensure proper isolation/level shifting between power domains. Though depicted sequentially as a matter of convenience, at least some of the actions shown can be performed in a different order and/or performed in parallel. Additionally, some implementations may perform only some of the actions shown. In the method 800, the behavior of circuitry (e.g., circuit 308) is represented as an SDO, and power information for the SDO (e.g., the power domain 304) is provided as a DPI.

In block 802, a flag or other indicator is added to a power format document to indicate that boundary ports of one or more power domains of the power format document are applied to enforce power domain association of the boundary ports. For example, a flag to "honor boundary port domains" may be inserted in the power format document.

In block 804, a power intent object is added to the power format document to preserve power domain information from a hierarchical PI to an inferred, flattened, integrated PI (IPI). For example, a power format user attribute may be added to the power format document to signal preservation of the power domain information. The IPI includes power information provided in the DPI.

In block 806, boundary ports in the power format document (e.g., the boundary port 402) are identified. The power format document may include a DPI that specifies a boundary port. For example, the DPI describing the power domain 304 is searched, and the boundary port 402 is identified. The parsing of the power format document to identify the boundary ports may be responsive to the detection of the flag added to the power format document in block 802. In some implementations, identifying a boundary port in the power format document includes identifying the boundary port in a BBPI of a hard design object, where the DPI is associated with an SDO that is a behavioral representation of the hard design object.

In block 808, for each boundary port identified in block 806, a non-wire object, such as a buffer (e.g., the buffer 318) is inserted in the SDO associated with the circuit 308. The non-wire object provides a means to definitively associate a power domain to the boundary port 402 of the SDO to ensure right isolation/level shifter between two power domains (e.g., to isolate the power domain 304 from the top-level power domain 302).

In block 810, for each non-wire object added to the SDO in block 808, the non-wire object is associated with the power domain of the boundary port identified in block 806 that triggered insertion of the non-wire object in the SDO. In various implementations, the power domain association (between the non-wire object and the power domain of the boundary port) may be added to the DPI prior to flattening that produces the IPI, or, after flattening, the power domain association may be added to the IPI.

In block 812, a verification procedure, such as a simulation, is executed using the SDO and the PI as modified in blocks 808 and 810 (e.g., the IPI). The IPI may be generated from hierarchical PI at any block of the method 800 prior to use. The power domain isolation provided by the added buffers corrects the improper signal association and corruption that may occur due to connection of power domains via a wire of an SDO.

Figure 9:
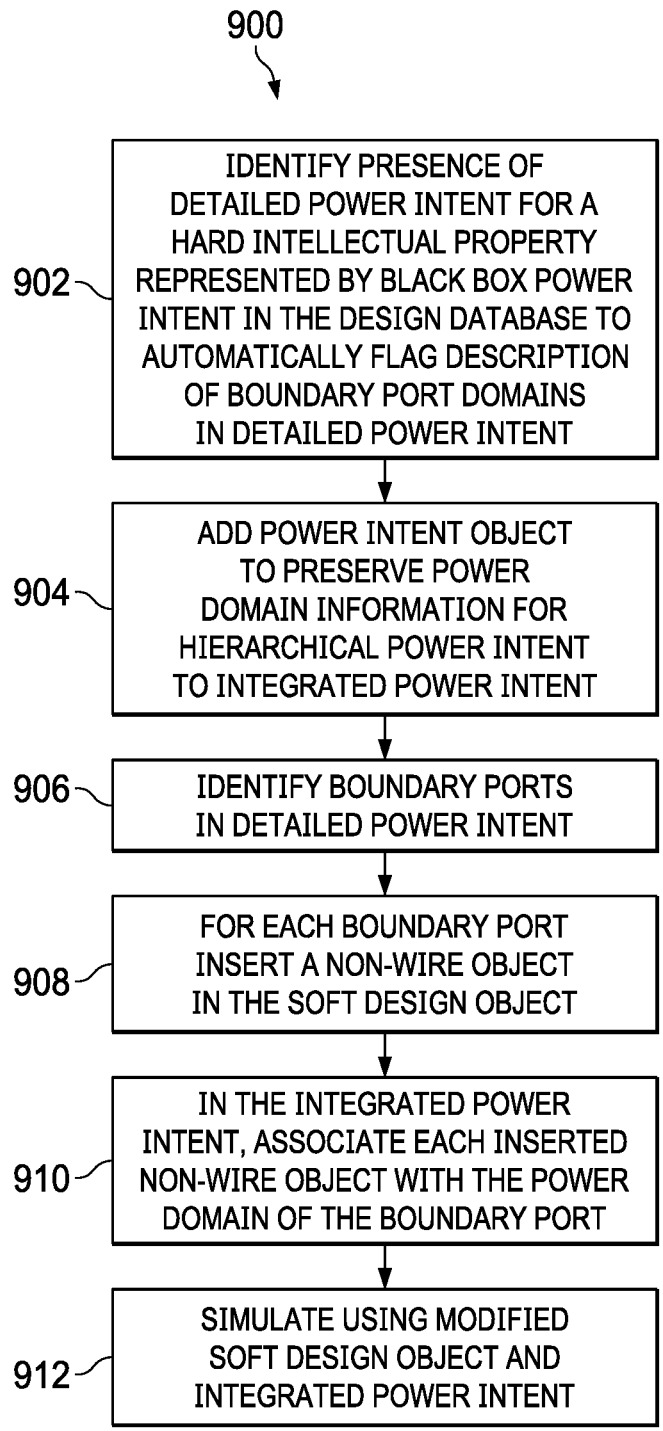
FIG. 9 shows a flow diagram for an example method for boundary port modelling that provides isolation between power domains.

FIG. 9 shows a flow diagram for an example method 900 for boundary port modelling that provides for definitive association of power domain to identified port of SDO to ensure proper isolation/level shifting between power domains. Though depicted sequentially as a matter of convenience, at least some of the actions shown can be performed in a different order and/or performed in parallel. Additionally, some implementations may perform only some of the actions shown. In the method 900, the behavior of circuitry (e.g., circuit 308) is represented as an SDO, and power information for the SDO (e.g., the power domain 304) is provided as a DPI.

In block 902, the need for user specification of boundary port processing is avoided by detecting the presence of DPI for a Hard IP with BBPI and absence of a fully implemented power connected gate/device level view. The need to enforce power domain association at the boundary ports is automatically inferred based on detection of the DPI and BBPI. Usually Hard IPs won't have, except in case of an early design state, DPI associated with them while the BBPI is present at all maturity levels. The user may select whether the design integration and verification are to be done with mature (BBPI) or early (DPI) view of the Hard IP.

In block 904, a power intent object is added to the power format document to preserve power domain information from a hierarchical PI to an inferred, flattened, integrated PI (IPI). For example, a power format user attribute may be added to the power format document to signal preservation of the power domain information. The IPI includes power information provided in the DPI.

In block 906, boundary ports in the power format document (e.g., the boundary port 402) are identified. The power format document may include a DPI that specifies a boundary port. For example, the DPI describing the power domain 304 is searched, and the boundary port 402 is identified. The parsing of the power format document to identify the boundary ports may be responsive to the detection of the DPI for the Hard IP with BBPI in block 902.

In block 908, for each boundary port identified in block 906, a non-wire object, such as a buffer (e.g., the buffer 318) is inserted in the SDO associated with the circuit 308. The non-wire object provides a means to definitively associate a power domain to the boundary port 402 of the SDO to ensure right isolation/level shifter between two power domains (e.g., to isolate the power domain 304 from the top-level power domain 302).

In block 910, for each non-wire object added to the SDO in block 908, the non-wire object is associated with the power domain of the boundary port identified in block 906 that triggered insertion of the non-wire object in the SDO. In various implementations, the power domain association (between the non-wire object and the power domain of the boundary port) may be added to the DPI prior to flattening that produces the IPI, or, after flattening, the power domain association may be added to the IPI.

In block 912, a verification procedure, such as a simulation, is executed using the SDO and the PI as modified in blocks 908 and 910 (e.g., the IPI). The IPI may be generated from hierarchical PI at any block of the method 800 prior to use. The power domain isolation provided by the added buffers corrects the improper signal association and corruption that may occur due to connection of power domains via a wire of an SDO.

Figure 10:
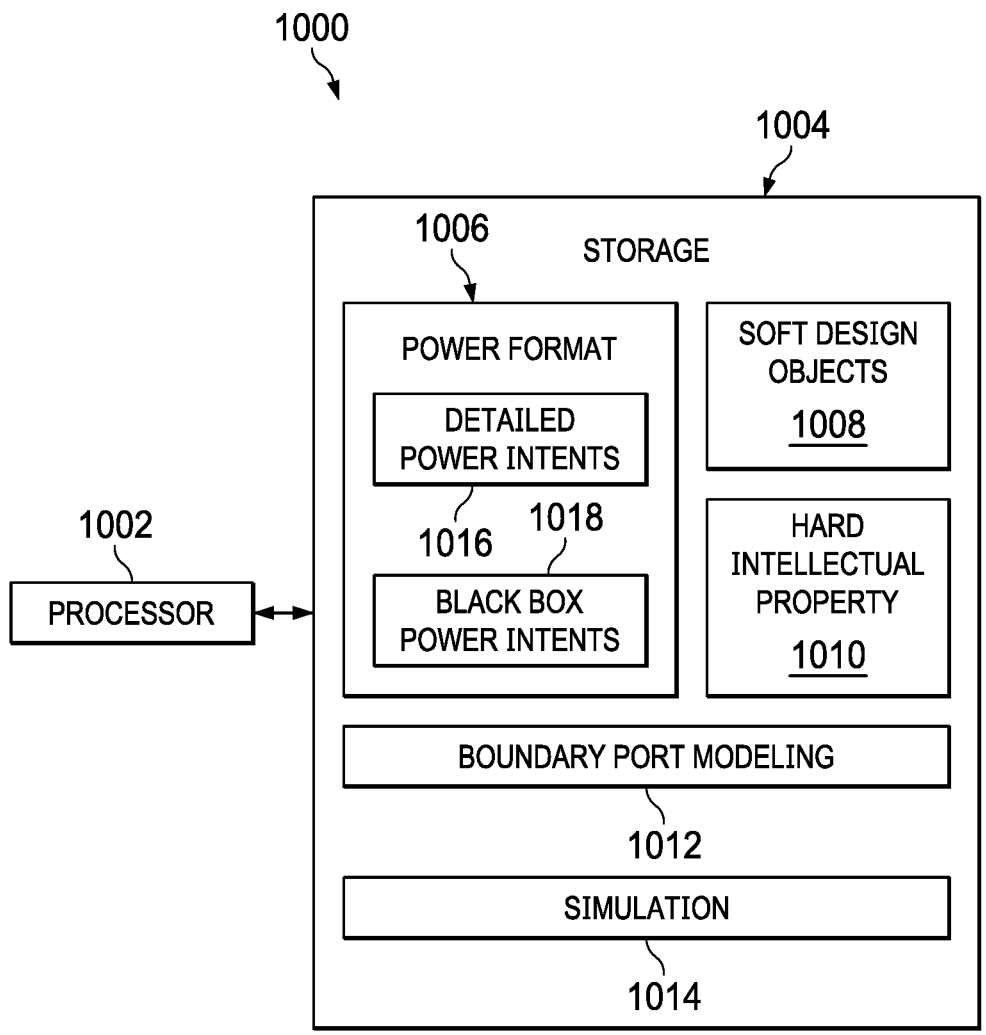
FIG. 10 shows a block diagram for an example system that implements boundary port modelling with isolation between power domains.

FIG. 10 shows a block diagram for an example system 1000 that implements boundary port modelling with isolation between power domains. The system 1000 includes a processor 1002 and storage 1004 coupled to the processor 1002. The processor 1002 may be a general-purpose microprocessor, a microcontroller, a digital signal processor, or other instruction execution device. The storage 1004 is a non-transitory computer-readable medium and may include volatile storage such as random-access memory, non-volatile storage (e.g., FLASH storage, read-only-memory, EEPROM), or combinations thereof. The storage 1004 is encoded with instructions that are executed by the processor 1002 to provide boundary port modelling that implements isolation between power domains as described herein.

The storage 1004 may include one or more power format document 1006, one or more SDO 1008, one or more hard design objects or Hard IP 1010, boundary port modelling instructions 1012, and simulation instructions 1014 (or other verification instructions). The power format document 1006 contains information specifying the power domains of a circuit, and the sub-circuits included in the power domains, power control rules, etc. The power format document 1006 may be for example, a CPF document or a UPF document.

The SDO 1008 includes RTL descriptions of digital circuitry and/or behavioral models of analog circuitry associated with the power format document 1006. The Hard IP 1010 includes descriptions (including behavioral models and/or device level netlists with device models (SPICE)) of fully placed and routed analog and/or digital circuits associated with the power format document 1006.

The boundary port modelling instructions 1012 includes instructions that are executed by the processor 1002 to implement boundary port modelling that provides power domain isolation as described herein. For example, the boundary port modelling instructions 1012 may include instructions that are executed by the processor 1002 to implement the method 700, the method 800, the method 900, or a portion thereof.

The simulation instructions 1014 includes instructions that are executed by the processor 1002 to simulate or otherwise verify the circuitry described by the power format document 1006, the SDO 1008, and/or the Hard IP 1010. The definitive power domain association provided by the buffers added to the SDO 1008 by the boundary port modelling instructions 1012 corrects the improper signal association and corruption that may occur due to connection of power domains via a wire of an SDO.

The system 1000 may be implemented using a general-purpose computer, such as a desktop, laptop, or rack-mounted computer that includes the processor 1002 and the storage 1004.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Modifications are possible in the described embodiments, and other embodiments are possible, within the scope of the claims.

What is claimed is:

1. A method, comprising:
identifying a boundary port of an integrated circuit responsive to determining that a development tool does not comply with a power specification for the boundary port:
identifying the boundary port in a register transfer level (RTL) model for the integrated circuit;
inserting, in the RTL model, a non-wire object coupled to the boundary port; and
assigning, in the power specification, a power domain to the non-wire object.

2. The method of claim 1, wherein the non-wire object is a buffer object.

3. The method of claim 1, further comprising:
identifying a flag, in a power format document including the power specification, indicating that the power domain is to be honored; and
parsing the power specification for the boundary port responsive to identifying the flag.

4. The method of claim 1, further comprising adding, to the power specification, a power attribute indicating that power domain information is to be preserved from a hierarchical power specification to an integrated power specification.

5. The method of claim 4, further comprising:
identifying the non-wire object in the integrated power specification; and
wherein assigning the power domain in the power specification comprises assigning the power domain in the integrated power specification.

6. The method of claim 1, wherein the power specification is a first power specification, and wherein identifying the boundary port in the RTL model comprises:
identifying the boundary port in a second power specification of a circuit device of the integrated circuit, wherein the RTL model is a behavioral representation of the circuit device of the integrated circuit.

7. The method of claim 1, further comprising: executing a simulation using the RTL model including the non-wire object and the power specification including the power domain assigned to the non-wire object.

8. A system, comprising:
a processor; and
a memory coupled to the processor, and the memory configured to store instructions that are executed by the processor to:
identify a boundary port of an integrated circuit;
responsive to determining that a development tool does not comply with a power specification for the boundary port;
identify the boundary port in a register transfer level (RTL) model for the integrated circuit;
insert, in the RTL model, a non-wire object coupled to the boundary port; and
assign, in the power specification, a power domain to the non-wire object.

9. The system of claim 8, wherein the non-wire object is a buffer object.

10. The system of claim 8, wherein the instructions are executed by the processor to:
identify a flag, in a power format document including the power specification, indicating that the power domain is to be honored; and
parse the power specification for the boundary port responsive to identifying the flag.

11. The system of claim 8, wherein the instructions are executed by the processor to:
identify, in the power specification, a power attribute indicating that power domain information is to be preserved from a hierarchical power specification to an integrated power specification.

12. The system of claim 11, wherein:
the integrated power specification includes power information from the power specification;
the instructions are executed by the processor to identify the non-wire object in the integrated power specification; and
the instructions that assign the power domain in the power specification assign the power domain in the integrated power specification.

13. The system of claim 8, wherein the power specification is a first power specification, and wherein the instructions are executed by the processor to identify the boundary port in a second power specification of a circuit device of the integrated circuit, wherein the RTL model is a behavioral representation of the circuit device of the integrated circuit.

14. The system of claim 8, wherein the instructions are executed by the processor to execute a simulation using the RTL model including the non-wire object and the power specification including the power domain assigned to the non-wire object.

15. A non-transitory computer-readable medium encoded with instructions that when executed cause a processor to:
identify a boundary port of an integrated circuit;
responsive to determining that a development tool does not comply with a power specification for the boundary port;
identify the boundary port in a register transfer level (RTL) model for the integrated circuit;
insert, in the RTL model, a non-wire object coupled to the boundary port; and
assign, in the power specification, a power domain to the non-wire object.

16. The non-transitory computer-readable medium of claim 15, wherein the non-wire object is a buffer object.

17. The non-transitory computer-readable medium of claim 15, wherein the instructions, when executed, cause the processor to:
identify a flag, in a power format document including the power specification, indicating that power domains are to be honored; and
parse the power specification for the boundary port responsive to identifying the flag.

18. The non-transitory computer-readable medium of claim 15,
wherein the instructions, when executed, cause the processor to identify, in the power specification, a power attribute indicating that power domain information is to be preserved from a hierarchical power specification to an integrated power specification.

19. The non-transitory computer-readable medium of claim 18, wherein:
the integrated power specification includes power information from the power specification;
the instructions, when executed, cause the processor to identify the non-wire object in the integrated power specification; and
the instructions that assign the power domain in the power specification assign the power domain in the integrated power specification.

20. The non-transitory computer-readable medium of claim 15, wherein the power specification is a first power specification, and wherein the instructions, when executed, cause the processor to identify the boundary port in a second power specification of a circuit device of the integrated circuit, wherein the RTL model is a behavioral representation of the circuit device of the integrated circuit.

21. The non-transitory computer-readable medium of claim 15, wherein the instructions, when executed, cause the processor to execute a simulation using the RTL model including the non-wire object and the power specification including the power domain assigned to the non-wire object.

* * * * *